(12) United States Patent  
Koyama et al.

(10) Patent No.: US 6,737,802 B2  
(45) Date of Patent: May 18, 2004

(54) LIGHT-EMITTING DEVICE

(75) Inventors: Tomoko Koyama, Suwa (JP); Takeo Kaneko, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 230 days.

(21) Appl. No.: 09/920,755

(22) Filed: Aug. 3, 2001

(65) Prior Publication Data

US 2002/0030442 A1 Mar. 14, 2002

(30) Foreign Application Priority Data

Aug. 11, 2000 (JP) ........................................ 2000-244747

(51) Int. Cl.[7] .............................................. H05B 33/00
(52) U.S. Cl. ........................ 313/506; 313/498; 428/917
(58) Field of Search ........................ 313/498, 501–509, 313/512; 362/84; 428/690, 917; 315/169.3

(56) References Cited

U.S. PATENT DOCUMENTS

| 5,780,174 | A | * | 7/1998 | Tokito et al. | ............. | 428/690 |
| 6,462,356 | B1 | * | 10/2002 | Koyama et al. | ............. | 257/79 |
| 6,487,231 | B1 | * | 11/2002 | Boucart et al. | ............. | 372/96 |
| 6,512,250 | B1 | * | 1/2003 | Koyama et al. | ............. | 257/98 |
| 6,587,620 | B2 | * | 7/2003 | Koyama et al. | ............. | 385/37 |

FOREIGN PATENT DOCUMENTS

| JP | 63-70257 A | 3/1988 |
| JP | 63-175860 A | 7/1988 |
| JP | 1-221741 A | 9/1989 |
| JP | 2-51101 A | 2/1990 |
| JP | 2-135359 A | 5/1990 |
| JP | 2-135361 A | 5/1990 |
| JP | 3-152184 A | 6/1991 |
| JP | 5-39480 A | 2/1993 |
| JP | 5-273427 A | 10/1993 |
| JP | 5-297202 A | 11/1993 |
| JP | 6-201907 A | 7/1994 |
| JP | 6-224115 A | 8/1994 |
| JP | 7-20637 A | 1/1995 |
| JP | 7-181689 A | 7/1995 |
| JP | 7-235075 A | 9/1995 |
| JP | 8-15506 A | 1/1996 |
| JP | 8-248276 A | 9/1996 |
| JP | 9-178901 A | 7/1997 |
| JP | 9-211728 A | 8/1997 |
| JP | 9-311238 A | 12/1997 |
| JP | 10-8300 A | 1/1998 |
| JP | 10-26702 A | 1/1998 |
| JP | 10-59743 A | 3/1998 |
| JP | 10-153967 A | 6/1998 |
| JP | 2000-35504 A | 2/2000 |

OTHER PUBLICATIONS

U.S. patent application Ser. No. 09/531,330, Koyama et al., filed Mar. 20, 2000.
U.S. patent application Ser. No. 09/762,614, Koyama et al., filed Feb. 9, 2001.
U.S. patent application Ser. No. 09/795,435, Koyama et al., filed Mar. 1, 2001.
U.S. patent application Ser. No. 09/869,157, Koyama et al., filed Jun. 25, 2001.
U.S. patent application Ser. No. 09/878,994, Koyama et al., filed Jun. 13, 2001.

* cited by examiner

*Primary Examiner*—Ashok Patel
(74) *Attorney, Agent, or Firm*—Oliff & Berridge, PLC

(57) ABSTRACT

A light-emitting device having a light-emitting layer capable of emitting light by electroluminescence, a pair of anode and cathode for applying an electric field to the light-emitting layer, and an optical element for causing light generated in the light-emitting layer to be transmitted in a predetermined direction. The optical element forms an incomplete photonic band capable of inhibiting spontaneous emission of light in one dimension or two dimensions and includes first and second medium layers. Light generated in the light-emitting layer is emitted by inhibiting spontaneous emission in two dimensions by a first optical element and a second optical element.

18 Claims, 10 Drawing Sheets

X1-X1

X2-X2

Y-Y

LIGHT-EMITTING DEVICE

Japanese Patent Application No. 2000-244747, filed on Aug. 11, 2000, is hereby incorporated by reference in its entirety.

TECHNICAL FIELD

The present invention relates to a light-emitting device using electroluminescence (EL).

BACKGROUND ART

A semiconductor laser is used as a light source for optical communications systems. The semiconductor laser excels in wavelength selectivity and is capable of emitting light in a single mode. However, it is difficult to fabricate a semiconductor laser because many stages of crystal growth are needed. Moreover, since types of light-emitting materials used for the semiconductor laser are limited, the semiconductor laser cannot emit light with various wavelengths.

Conventional EL light-emitting devices emit light with a broad spectral width and are used in some applications such as for displays. However, conventional EL light-emitting devices are unsuitable for optical communications and the like in which light with a narrow spectral width is required.

SUMMARY OF THE INVENTION

An objective of the present invention is to provide a light-emitting device which can emit light with a remarkably narrow spectral width in comparison with conventional EL light-emitting devices and with directivity, and is applicable not only to displays but also to optical communications and the like.

First Light-emitting Device

A first light-emitting device according to a first aspect of the present invention comprises:

a light-emitting layer which emits light by electroluminescence;

a pair of electrode layers for applying an electric field to the light-emitting layer; and an optical element for causing light generated in the light-emitting layer to be transmitted in a predetermined direction, wherein the optical element forms an incomplete photonic band which inhibits spontaneous emission of light in one dimension or two dimensions; and wherein light generated in the light-emitting layer is emitted by inhibiting spontaneous emission in two dimensions.

The incomplete photonic band used herein refers to a band formed in the case where a complete photonic band gap is not formed. For example, in the case where the optical element is in a shape of grating in which a first medium layer and a second medium layer are arranged alternately, a complete photonic band gap may not be formed when the difference in the refractive indices between the first medium layer and the second medium layer is small.

According to the first light-emitting device, electrons and holes are injected into the light-emitting layer respectively from the pair of electrode layers, specifically, a cathode and an anode. Light is emitted when the molecules return to the ground state from the excited state by allowing the electrons and holes to recombine in the light-emitting layer. Spontaneous emission of this light is inhibited in two dimensions, whereby the light has a very narrow spectral width and high efficiency.

Specifically, in the first light-emitting device, a photonic band is formed by the optical element. In this band, a high density of states is obtained at energy at a specific band edge. If the optical element is formed so that the energy level of the light spectrum emitted in the light-emitting layer includes the energy level at this band edge, emission of light in the light-emitting layer tends to occur at the energy level at this band edge. Therefore, the first light-emitting device is capable of emitting light with a wavelength corresponding to the energy level at a predetermined band edge and with a narrow spectral width, thereby exhibiting high emission efficiency.

Second Light-emitting Device

A second light-emitting device according to a second aspect of the present invention comprises a substrate and a light-emitting section, wherein the light-emitting section includes:

a light-emitting layer which emits light by electroluminescence;

a pair of electrode layers for applying an electric field to the light-emitting layer;

an optical element for causing light generated in the light-emitting layer to be transmitted in a predetermined direction; and an insulating layer which is disposed between the pair of electrode layers, partially has an opening through which current is supplied to the light-emitting layer, and functions as a current blocking layer which determines a region in which current flows, wherein the optical element forms an incomplete photonic band which inhibits spontaneous emission of light in one dimension or two dimensions; and wherein light generated in the light-emitting layer is emitted by inhibiting spontaneous emission in two dimensions.

According to the second light-emitting device, since the insulating layer in the light-emitting section functions as a current blocking layer in addition to the effects of the first light-emitting device, the region for current supplied to the light-emitting layer can be specified. Therefore, current intensity and current distribution can be controlled in the region from which it is desired to emit light, whereby light can be emitted with high emission efficiency.

In the case where the insulating layer functions as cladding, in the case of a waveguide including a light-emitting layer as a core and an insulating layer as cladding, the waveguide mode of light transmitted to the waveguide section through a light-transmitting section can be controlled by specifying the opening in the insulating layer. Specifically, the waveguide mode of light transmitted through the light-emitting layer (core) can be set at a predetermined value by specifying the width of the region in which light is confined (the width perpendicular to the direction in which light is transmitted) by the insulating layer (cladding). The waveguide mode and the waveguide generally have a relation represented by the following equation.

$$N\text{max}+1 \geq K_0 \cdot a \cdot (n_1^2 - n_2^2)^{1/2} / (\pi/2)$$

$K_0$: $2\pi/\lambda$ a: half width of waveguide core $n_1$: refractive index of waveguide core $n_2$: refractive index of waveguide cladding Nmax: maximum value of possible waveguide mode Therefore, in the case where the parameters of the above equation such as the refractive indices of the core and cladding are specified, the width of the light-emitting layer (core) specified by the width of the opening in the current blocking layer is selected depending on the desired waveguide mode. Specifically, the width (2a) of the light-emitting layer corresponding to the core in a desired waveguide mode can be calculated from the above equation by substituting the refractive indices of the light-emitting layer provided in the current blocking layer and the insulating layer as a current blocking layer for the refractive indices of the core and cladding of the waveguide, respectively. It is preferable to determine the width of the core layer in the waveguide section to which light is supplied from the light-emitting section while taking into consideration the width of the light-emitting layer determined as described above, the calculated value obtained from the above equation based on the desired waveguide mode, and the like. Light in a desired mode is transmitted from the light-emitting section to the waveguide section with high connective efficiency by setting the width of the light-emitting layer, the width of the core layer, and the like to optimum values. In the light-emitting section, there may be a case where the light-emitting layer in the current blocking layer formed by the insulating layer does not uniformly emit light. Therefore, it is preferable that the designed values for each section such as the light-emitting layer, light-transmitting section, and waveguide section be suitably adjusted based on the width (2a) of the core (light-emitting layer) calculated using the above equation so that each section exhibits high connective efficiency.

The waveguide mode of the light-emitting device is preferably 0 to 1000. In particular, the waveguide mode is preferably about 0 to 10 in communication applications. Light with a predetermined waveguide mode can be efficiently obtained by specifying the waveguide mode of light in the light-emitting layer in this manner.

Third Light-emitting Device

A third light-emitting device according to a third aspect of the present invention comprises a substrate, a light-emitting section and a waveguide section which transmits light from the light-emitting section, the light-emitting and waveguide sections being integrally formed on the substrate, wherein the light-emitting section includes:
   a light-emitting layer which emits light by electroluminescence;
   a pair of electrode layers for applying an electric field to the light-emitting layer;
   an optical element for causing light generated in the light-emitting layer to be transmitted in a predetermined direction; and
   an insulating layer which is disposed between the pair of electrode layers and functions as a cladding layer,
wherein the waveguide section includes:
   a core layer which is integrally continuous with at least part of the optical element; and
   a cladding layer optically continuous with the insulating layer,
wherein the optical element forms an incomplete photonic band which inhibits spontaneous emission of light in one dimension or two dimensions, and
wherein light generated in the light-emitting layer is emitted by inhibiting spontaneous emission in two dimensions.

In addition to the effects of the first light-emitting device, according to the third light-emitting device, at least part of the optical element in the light-emitting section is integrally continuous with the core layer in the waveguide section, and the insulating layer (cladding layer) in the light-emitting section is integrally continuous with the cladding layer in the waveguide section, so that the light-emitting section and the waveguide section are optically combined with high connective efficiency, thereby enabling efficient transmission of light.

In this configuration, a material which functions as a cladding layer for the optical element is selected as the material for the insulating layer. According to this light-emitting device, since at least part of the optical element in the light-emitting section and the core layer in the waveguide section can be deposited and patterned in the same steps, the fabrication can be simplified. Moreover, the insulating layer (cladding layer) in the light-emitting section and the cladding layer in the waveguide section can be deposited and patterned in the same steps. This also simplifies the fabrication.

According to the present invention, a light-emitting device including an optical element which forms an incomplete photonic band in one dimension or two dimensions which can emit light with a remarkably narrow spectral width in comparison with conventional EL light-emitting devices and exhibiting directivity, and can be applied not only to displays but also to optical communications and the like, can be provided.

In the second and third light-emitting devices, the opening formed in the insulating layer which functions as a current blocking layer and a cladding layer may be in the shape of a slit extending in the periodic direction of the optical element, specifically, in the direction in which light is waveguided. At least part of the light-emitting layer may be present in the opening formed in the insulating layer. According to this configuration, the region of the light-emitting layer to which it is desired to supply current and the region specified by the current blocking layer can be positioned self-alignably.

In the second and third light-emitting devices, the optical element has only to have a periodic refractive index distribution in one dimension or two dimensions and forms an incomplete photonic band in one dimension or two dimensions. The optical element may have a structure such as a grating-shaped structure, a multilayer film structure, a columnar-shaped structure, or a combination of these structures. Followings are examples of the optical element.

(A) The optical element may have a refractive index distribution which is periodic in one direction in the XY surface and include first and second medium layers arranged alternately. In the case of using such an optical element, the light-emitting device according to the present invention may comprise another optical element which forms an incomplete photonic band capable of inhibiting spontaneous emission of light in two dimensions in combination with the incomplete photonic band in one dimension formed by the above optical element. The other optical element has only to inhibit transmission of light at least in the Z direction. For example, a photonic crystal capable of forming either a complete photonic band gap or incomplete photonic band gap or an optical layer such as a cladding layer or a dielectric multilayer mirror may be used. Light with a very narrow spectral width of which the spontaneous emission is inhibited in two dimensions by the optical element and the other optical element can be obtained with high efficiency.

(B) The optical element may have in the XY surface a refractive index distribution which is periodic in first and second directions and include column-shaped first medium layers arranged in the shape of a tetragonal lattice and a second medium layer formed between the first medium layers. This optical element can form an incomplete photonic band in which spontaneous emission is inhibited in two directions in two dimensions, whereby light with a very narrow spectral width can be obtained with high efficiency.

(C) The optical element may have in the XY surface a refractive index distribution which is periodic in first, second, and third directions and include column-shaped first medium layers arranged in the shape of a triangular lattice or a honeycomb lattice, and a second medium layer formed between the first medium layers, for example. This optical element can form an incomplete photonic band in which spontaneous emission is inhibited in at least three directions in two dimensions, whereby light with a very narrow spectral width can be obtained with high efficiency.

The light-emitting layer may include an organic light-emitting material. Use of an organic light-emitting material widens the range of selection of materials in comparison with the case of using a semiconductor material or inorganic material, thereby enabling emission of light with various wavelengths.

Examples of the materials which can be used for each section of the light-emitting device according to the present invention are illustrated below. These materials are only some of available conventional materials. Materials other than the materials illustrated below may also be used.

Light-emitting Layer

The material for the light-emitting layer is selected from conventional compounds in order to obtain light with a predetermined wavelength. The material for the light-emitting layer may be either an organic compound or an inorganic compound. It is preferable to use an organic compound from the viewpoint of availability of a wide variety of compounds and deposition capability.

As examples of such organic compounds, organic compounds disclosed in Japanese Patent Application Laid-open No. 10-153967, such as aromatic diamine derivatives (TPD), oxydiazole derivatives (PBD), oxydiazole dimers (OXD-8), distyrylarylene derivatives (DSA), beryllium-benzoquinolinol complex (Bebq), triphenylamine derivatives (MTDATA), rubrene, quinacridone, triazole derivatives, polyphenylene, polyalkylfluorene, polyalkylthiophene, azomethine zinc complex, polyphyrin zinc complex, benzooxazole zinc complex, and phenanthroline europium complex can be given.

Conventional compounds disclosed in Japanese Patent Application Laid-open No. 63-70257, No. 63-175860, No. 2-135361, No. 2-135359, No. 3-152184, No. 8-248276, No. 10-153967, and the like may be used as the material for the organic light-emitting layer. These compounds may be used either individually or in combination of two or more.

As examples of inorganic compounds, ZnS:Mn (red region), ZnS:TbOF (green region), SrS:Cu, SrS:Ag, SrS:Ce (blue region), and the like can be given.

Optical Waveguide

The optical waveguide includes a layer which functions as a core and a layer which has a refractive index lower than that of the core and functions as cladding. Specifically, these layers include the light-transmitting section (core) and the insulating layer (cladding) in the light-emitting section, the core layer and the cladding layer in the waveguide section, the substrate (cladding), and the like. Conventional inorganic and organic materials may be used for the layers which make up the optical waveguide.

As typical examples of inorganic materials, $TiO_2$, $TiO_2$—$SiO_2$ mixture, $ZnO$, $Nb_2O_5$, $Si_3N_4$, $Ta_2O_5$, $HfO_2$, and $ZrO_2$ disclosed in Japanese Patent Application Laid-open No. 5-273427, and the like can be given.

As typical examples of organic materials, various types of conventional resins such as thermoplastic resins, thermosetting resins, and photocurable resins can be given. These resins are appropriately selected depending on the layer formation method and the like. For example, use of a resin which can be cured by energy of at least either heat or light enables utilization of commonly used exposure devices, baking ovens, hot plates, and the like.

As examples of such substances, a UV-curable resin disclosed in Japanese Patent Application Laid-open No. 2000-35504 applied by the applicant of the present invention can be given. Acrylic resins are suitable as UV-curable resins. UV-curable acrylic resins excelling in transparency and capable of being cured in a short period of time can be obtained by using various types of commercially-available resins and photosensitizers As specific examples of basic components of UV-curable acrylic resins, prepolymers, oligomers, and monomers can be given.

As examples of prepolymers and oligomers, acrylates such as epoxy acrylates, urethane acrylates, polyester acrylates, polyether acrylates, and spiroacetal-type acrylates, methacrylates such as epoxy methacrylates, urethane methacrylates, polyester methacrylates, and polyether methacrylates, and the like can be given.

As examples of monomers, monofunctional monomers such as 2-ethylhexyl acrylate, 2-ethylhexyl methacrylate, 2-hydroxyethyl acrylate, 2-hydroxyethyl methacrylate, N-vinyl--2-pyrrolidone, carbitol acrylate, tetrahydrofurfuryl acrylate, isobornyl acrylate, dicyclopentenyl acrylate, and 1,3-butanediol acrylate, bifunctional monomers such as 1,6-hexanediol diacrylate, 1,6-hexanediol dimethacrylate, neopentyl glycol diacrylate, neopentyl glycol dimethacrylate, ethylene glycol diacrylate, polyethylene glycol diacrylate, and pentaerythritol diacrylate, and polyfunctional monomers such as trimethylolpropane triacrylate, trimethylolpropane trimethacrylate, pentaerythritol triacrylate, and dipentaerythritol hexaacrylate can be given.

These inorganic and organic materials are illustrated taking into consideration only light confinement. In the case where the light-emitting section includes a light-emitting layer, a hole transport layer, an electron transport layer, and an electrode layer, and at least one of these layers functions as the core or cladding, materials for these layers may be employed as the material for the layers which make up the optical waveguide.

Hole Transport Layer

In the case of using an organic light-emitting layer in the light-emitting section, a hole transport layer may be optionally provided between the electrode layer (anode) and the light-emitting layer. As the materials for the hole transport layer, materials used as hole injection materials for photoconductive materials or materials used for a hole injection layer of organic light-emitting devices may be selectively used. The material for the hole transport layer is either an organic substance or an inorganic substance having a function of either hole injection or electron barrier characteristics. As specific examples of such substances, substances disclosed in Japanese Patent Application Laid-open No. 8-248276 can be given.

Electron Transport Layer

In the case of using an organic light-emitting layer in the light-emitting section, an electron transport layer may be optionally provided between the electrode layer (cathode) and the organic light-emitting layer. The electron transport layer has a function of transmitting electrons injected from the cathode to the organic light-emitting layer. The material for the electron transport layer may be selected from conventional substances. Substances disclosed in Japanese Patent Application Laid-open No. 8-248276 can be given as specific examples.

Electrode Layer

As the material for the cathode, electron injectable metals, alloys, electrically conductive compounds having a small work function (4 eV or less, for example), or mixtures of these may be used. Substances disclosed in Japanese Patent Application Laid-open No. 8-248276 can be given as specific examples of such electrode materials.

As the material for the anode, metals, alloys, electrically conductive compounds having a large work function (4 eV or more, for example), or mixtures of these may be used. In the case of using an optically transparent material for the anode, transparent conductive materials such as CuI, ITO, $SnO_2$, and ZnO may be used. In the case where transparency is unnecessary, metals such as gold may be used.

In the present invention, the formation method for the optical element is not limited. Conventional methods may be used. Typical examples of such methods are given below.

(1) Lithographic Method

A resist layer is patterned by subjecting a positive or negative resist to exposure to ultraviolet rays, X-rays, or the like and development, thereby forming the optical element. Japanese Patent Applications Laid-open No. 6-224115 and No. 7-20637 disclose patterning technology using a resist formed of polymethylmethacrylate or a novolak resin.

Japanese Patent Applications Laid-open No. 7-181689 and No. 1-221741 disclose technology for patterning a polyimide using photolithography. Japanese Patent Application Laid-open No. 10-59743 discloses technology for forming an optical element formed of polymethylmethacrylate or titanium oxide on a glass substrate utilizing laser ablation.

(2) Method in which Regions Having Different Refractive Indices are Formed by Light Irradiation Regions having different refractive indices are formed periodically in the optical waveguide section by irradiating the optical waveguide section with light with a wavelength which causes a change in the refractive index, thereby forming the optical element. As such a method, it is preferable to form the optical element by forming a layer of a polymer or a polymer precursor and polymerizing part of the layer by irradiation or the like, thereby periodically forming the areas having different refractive indices. This type of techniques are disclosed in Japanese Patent Applications Laid-open No. 9-311238, No. 9-178901, No. 8-15506, No. 5-297202, No. 5-39480, No. 9-211728, No. 10-26702, No. 10-8300, No. 2-51101, for example.

(3) Stamping Method

The optical element is formed by hot stamping using a thermoplastic resin (Japanese Patent Application Laid-open No. 6-201907), stamping using an UV curable resin (Japanese Patent Application Laid-open No. 2000-35504), or stamping using an electron beam curable resin (Japanese Patent Application Laid-open No. 7-235075), or the like.

(4) Etching Method

The optical element is formed by selectively removing and patterning a thin film using lithography and etching technologies.

The method for forming the optical element is described above. In summary, the optical element consists of at least two areas having different refractive indices. The optical element may be formed by a method of forming the two areas using two types of materials having different refractive indices, a method of forming the two areas having different refractive indices by modifying part of one type of material, or the like.

Each layer of the light-emitting device may be formed using a conventional method. A deposition method suitable for each layer of the light-emitting device is appropriately selected depending on the materials therefor. As specific examples of such a method, a vapor deposition method, spin coating method, LB method, ink jet method, and the like can be can be given.

DETAILED DESCRIPTION OF THE EMBODIMENTS

First Embodiment

Figure 1:
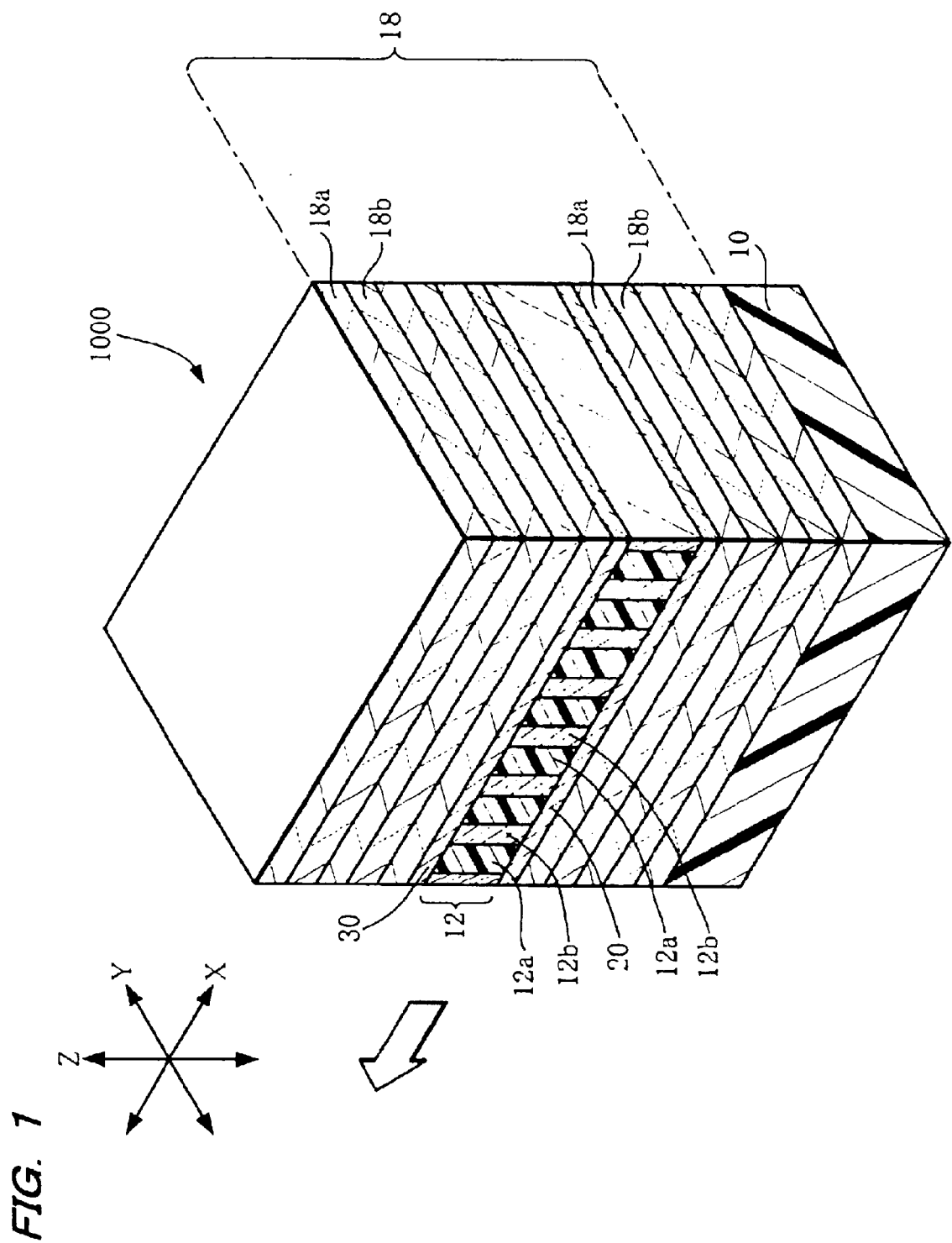
FIG. 1 is a perspective view schematically showing a light-emitting device according to a first embodiment.

FIG. 1 is a perspective view schematically showing a light-emitting device 1000 having cross sections according to this embodiment of the present invention. The light-emitting device 1000 includes a substrate 10, an anode 20, a cathode 30, a first optical element 12, and a second optical element 18.

The first optical element 12 has a periodic refractive index distribution in a first direction (X direction) based on the shape (size) and the medium combination, and forms an incomplete photonic band for a predetermined wavelength range. The second optical element 18 has a periodic refractive index distribution in the Z direction which intersects the X direction at right angles, based on the shape (size) and the medium combination, and forms a photonic crystal for a predetermined wavelength range, for example. The first optical element 12 is formed in the middle of the periodic direction (direction in which different medium layers are repeated periodically) of the second optical element 18. The second optical element 18 is continuously formed on upper and lower sides of the first optical element 12.

The first optical element 12 has a grating structure in which a first medium layer 12a and a second medium layer 12b having different refractive indices are arranged alternately. The second optical element 18 includes a first medium layer 18a and a second medium layer 18b having different refractive indices arranged alternately. In the present embodiment, the first medium layer 12a in the first optical element 12 is formed using an organic light-emitting layer.

The first optical element 12 forms an incomplete photonic band. The first optical element 12 is formed so that the energy level of the emission spectrum of the organic light-emitting layer 12a includes the energy level at the band edge included in the band formed by the first optical element 12. Specifically, a photonic band is formed by the first optical element 12. In this band, a high density of states is obtained at the energy level at a specific band edge. The first optical element 12 is formed so that the spectrum of light emitted in the organic light-emitting layer 12a includes the energy level at this band edge. Therefore, emission of light in the organic light-emitting layer 12a tends to occur at the energy level at this band edge. Therefore, a device capable of emitting light with a wavelength corresponding to the energy level at the band edge of the first optical element 12 and a narrow spectral width can be obtained at high yields.

A distributed feedback-type grating is preferably used for the first optical element 12. This enables emission of light excelling in wavelength selectivity and directivity and having a narrow spectral width. The first optical element 12 preferably has either a refractive index coupled structure or a gain coupled structure.

The second optical element 18 has a periodic refractive index distribution in the Z direction based on the shape (size) and the medium combination and inhibits transmission of light in one dimension in a predetermined wavelength range. The second optical element 18 may form either an incomplete photonic band or a complete photonic band gap insofar as the second optical element 18 can inhibit transmission of light at least in one dimension.

Specifically, both the first optical element 12 and the second optical element 18 may form an incomplete photonic band. In this case, the incomplete photonic band of the second optical element 18 is set so that the incomplete photonic band includes at least the wavelength range of the emission spectrum from the organic light-emitting layer 12a by electrical pumping, and light emitted in the organic light-emitting layer 12a is not transmitted through the second optical element 18.

The first optical element 12 may form an incomplete photonic band and the second optical element 18 may form a complete photonic band gap. In this case, light within the band formed by the second optical element 18 cannot be transmitted in the direction controlled by the second optical element 18. Therefore, designing the optical elements so that the band edge of the first optical element 12 is included in the band formed by the second optical element 18 enables light having a wavelength corresponding to the energy level at the band edge of the first optical element 12 to be emitted in the direction controlled by the first optical element 12.

In the light-emitting device 1000 of the present embodiment, since light is confined by the first optical element 12 having an incomplete photonic band in the X direction and the second optical element 18 having either an incomplete photonic band or a complete photonic band gap in the Z direction, spontaneous emission of light can be controlled in the X and Z directions in two dimensions. Light in a leaky mode can be transmitted in other directions. In order to control the transmission of light in a leaky mode, a cladding layer or a dielectric multilayer mirror (not shown) may be optionally provided in order to confine light. This also applies to other embodiments.

There are no specific limitations to the materials for the first medium layer 12a and the second medium layer 12b which make up the first optical element 12 and the materials for the first medium layer 18a and the second medium layers 18b which make up the second optical element 18, insofar as these layers can form a photonic crystal which satisfies the above conditions by the periodic distribution. For example, one of the medium layer in the first optical element 12 may be gas such as air. In the case of forming a grating having an air-gap structure using a gaseous layer, the difference in the refractive indices between two medium layers which make up the grating can be increased within the range of selection of the materials commonly used for light-emitting devices.

The anode 20 is formed on the lower side of the first optical element 12 and the cathode 30 is formed on the upper side of the first optical element 12. It is preferable that the anode 20 and the cathode 30 be optically transparent for light to be emitted. The anode 20 and the cathode 30 may be respectively disposed on the opposite sides. This also applies to other embodiments.

The operations of the light-emitting device 1000 are described below.

Electrons and holes are injected into the organic light-emitting layer 12a respectively from the cathode 30 and the anode 20 by applying a predetermined voltage to the anode 20 and the cathode 30. The electrons and holes are allowed to recombine in the organic light-emitting layer 12a, whereby excitons are generated. Light at the energy level at the band edge is transmitted through the first optical element 12 at the XY surface, whereas no light is transmitted through the second optical element 18 in the Z direction. Therefore, light with a wavelength specified by the energy level at the band edge is emitted preferentially in the X direction in which the degree of light confinement is smaller. This light has a very narrow spectral width and high efficiency.

The light-emitting device 1000 of the present embodiment includes the organic light-emitting layer 12a. Therefore, the light-emitting device 1000 is not affected by the irregular state and impurities at the boundary of the light-emitting layer as in the case of using semiconductors, whereby an excellent photonic crystal can be obtained. This also applies to other embodiments.

The above methods and materials may be appropriately used as the method for forming the optical elements 12 and 18 of the light-emitting device 1000 and the materials for forming each layer. A hole transport layer and an electron transport layer may be optionally provided between the organic light-emitting layer and the electrodes. These methods, materials, and configurations are also applied to other embodiments described later.

Second Embodiment

Device

Figure 2:
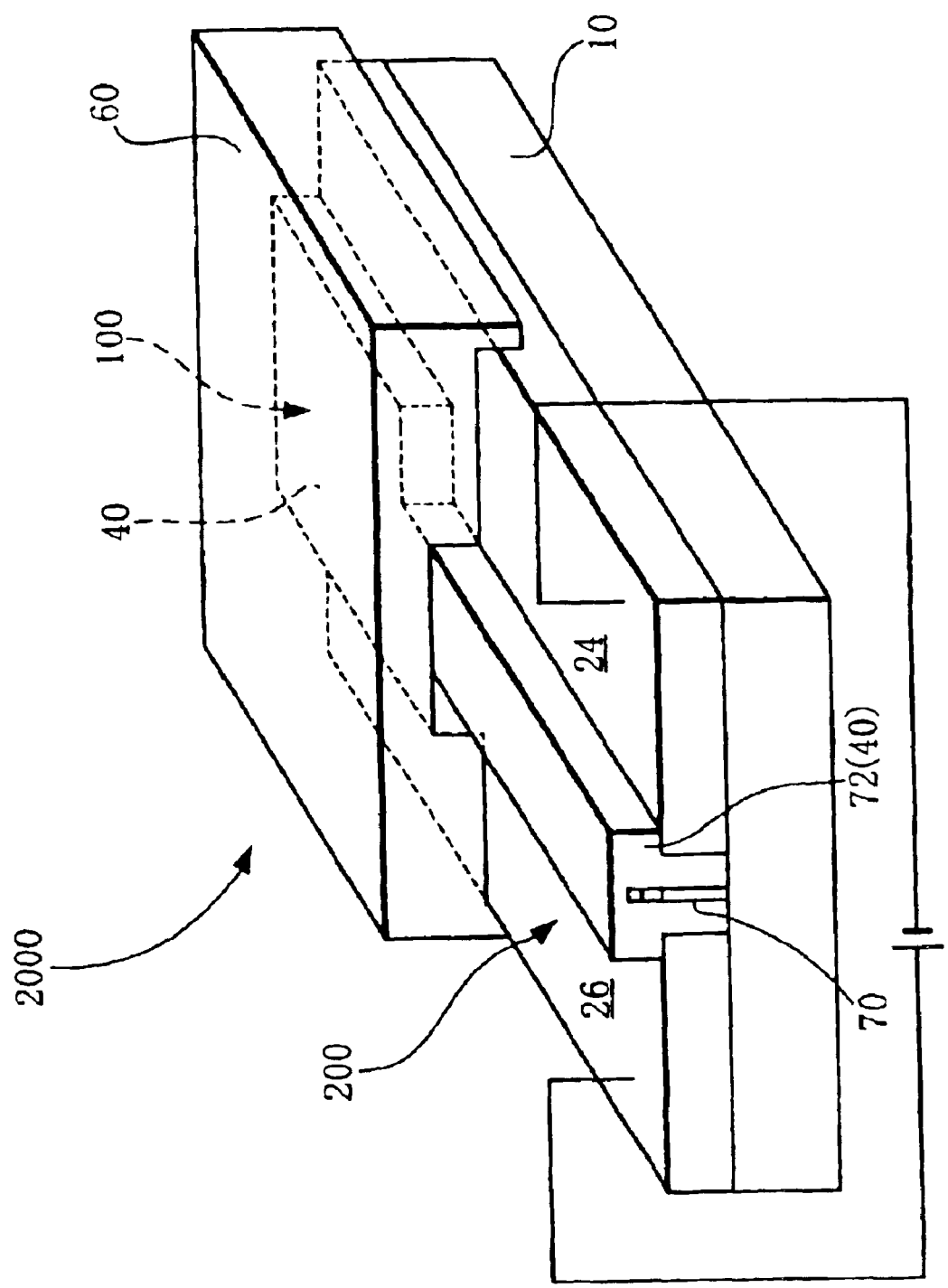
FIG. 2 is a perspective view schematically showing a light-emitting device according to a second embodiment.
Figure 3:
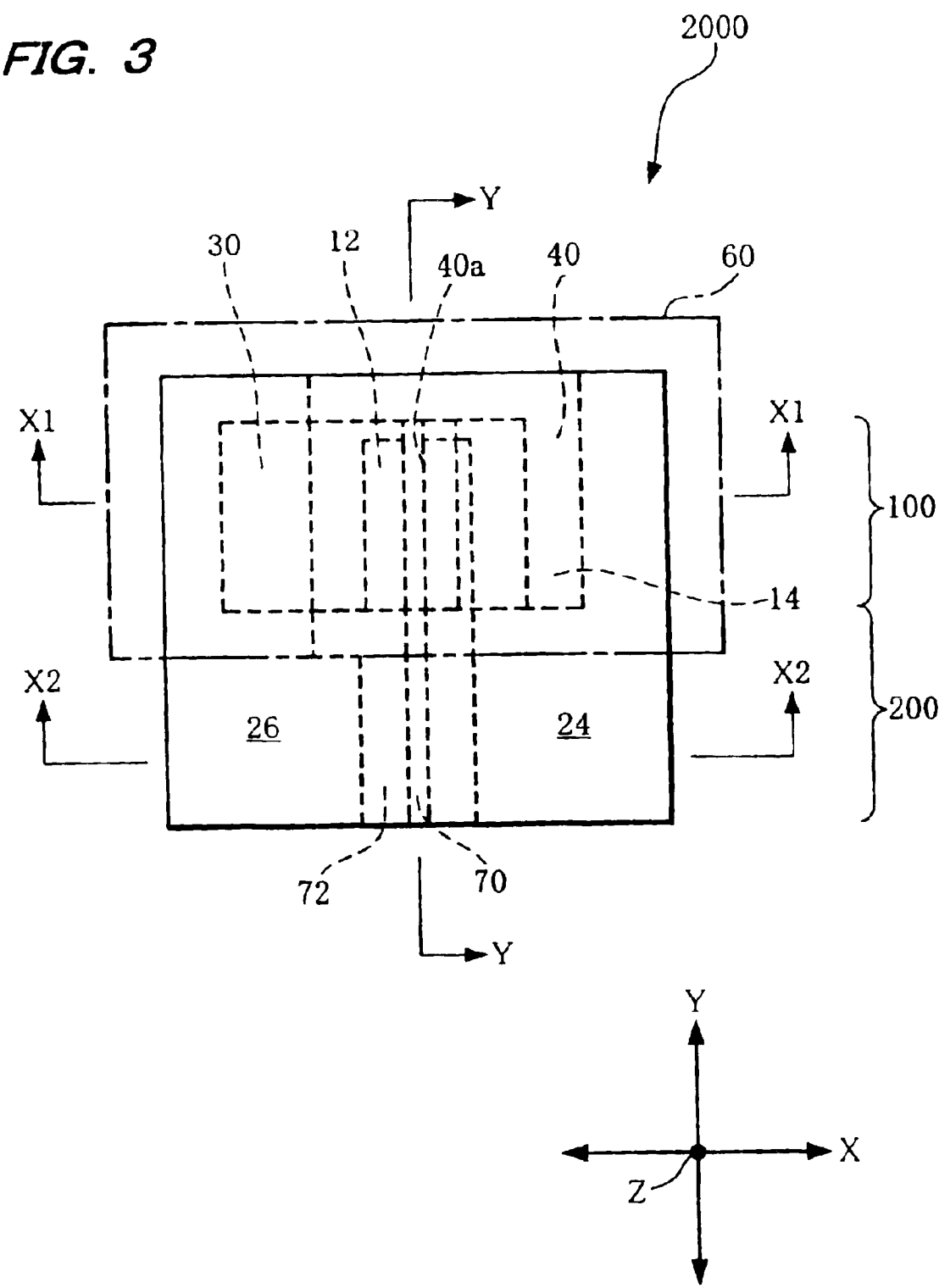
FIG. 3 is a plan view schematically showing the light-emitting device according to the second embodiment.
Figure 4:
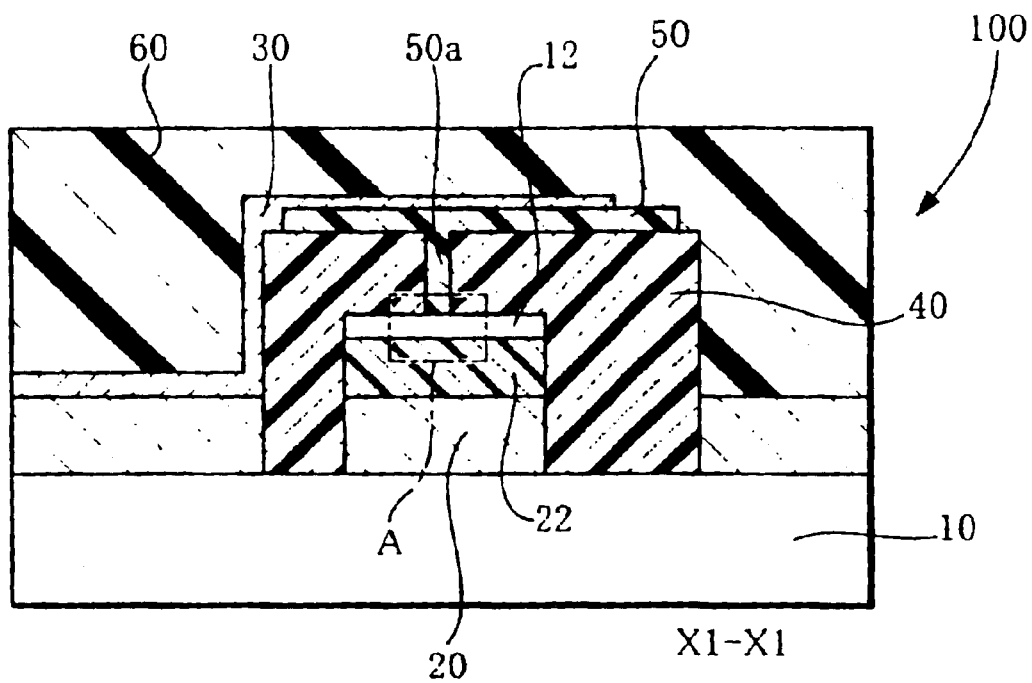
FIG. 4 is a cross-sectional view along the line X1—X1 shown in FIG. 3.
Figure 6:
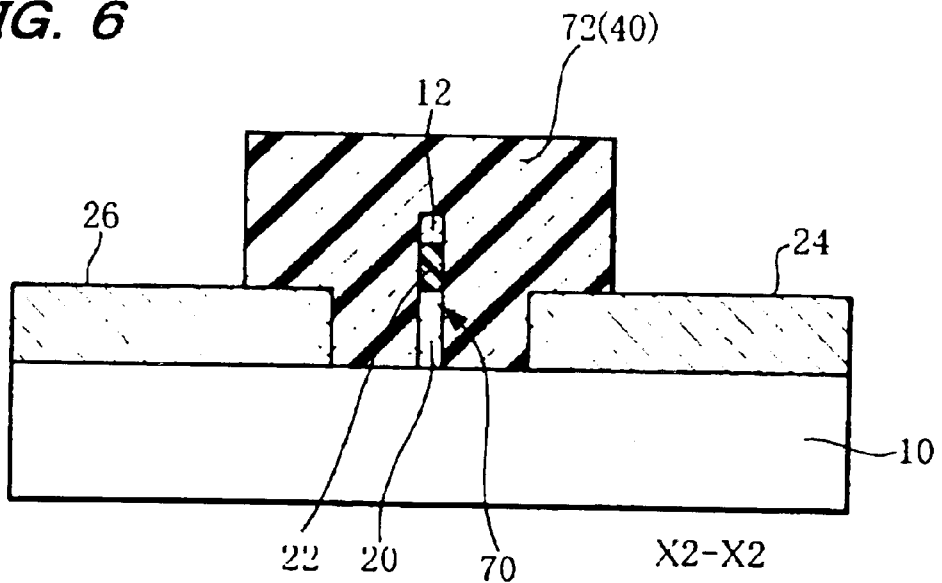
FIG. 6 is a cross-sectional view along the line X2—X2 shown in FIG. 3.
Figure 7:
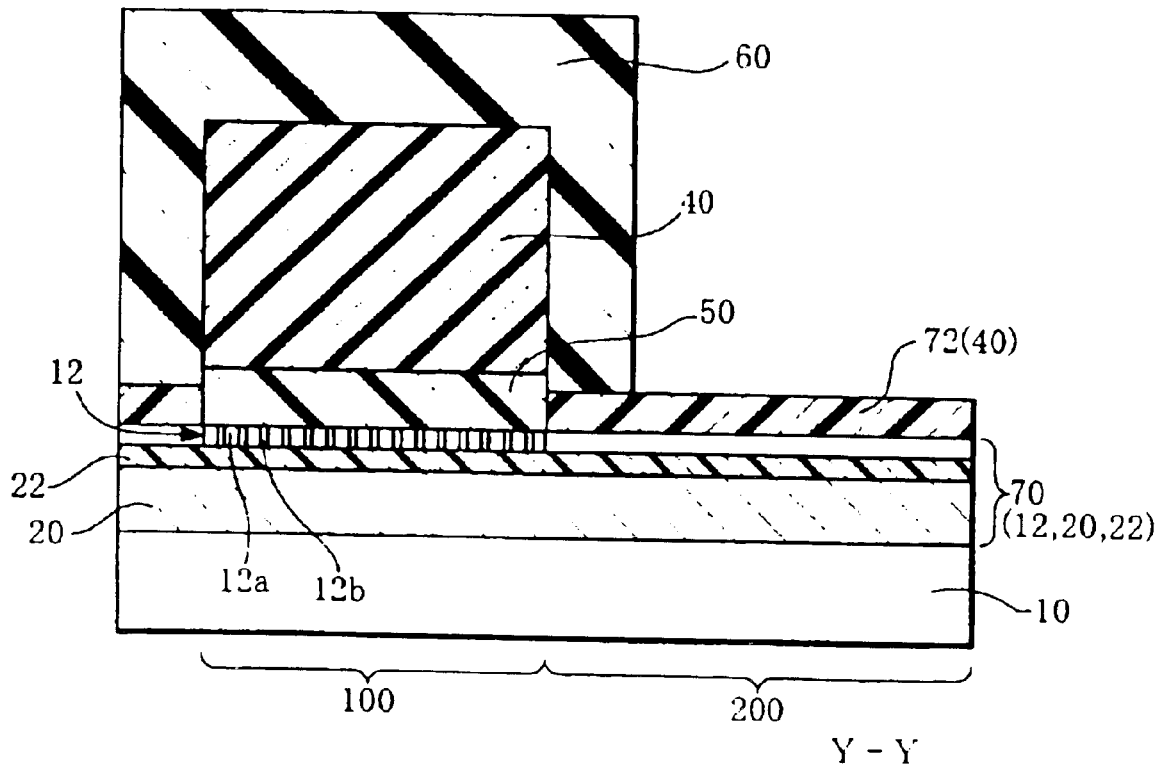
FIG. 7 is a cross-sectional view along the line Y—Y shown in FIG. 3.

FIG. 2 is a perspective view schematically showing a light-emitting device 2000 according to this embodiment of the present invention. FIG. 3 is a plan view schematically showing the light-emitting device 2000. FIG. 4 is a cross-sectional view taken along the line X1—X1 shown in FIG. 3. FIG. 6 is a cross-sectional view taken along the line X2—X2 shown in FIG. 3. FIG. 7 is a cross-sectional view taken along the line Y—Y shown in FIG. 3.

The light-emitting device 2000 includes the substrate 10, a light-emitting section 100, and a waveguide section 200, which are formed on the substrate 10.

In the light-emitting section 100, the anode 20, a hole transport layer 22, the optical element 12 capable of forming an incomplete photonic band in two dimensions, a light-emitting layer 50, and the cathode 30 are disposed on the substrate 10 in that order. An insulating layer 40 which functions as a cladding layer and a current blocking layer is formed to surround the hole transport layer 22 and the optical element 12.

In the waveguide section 200, a core layer 70 and a cladding layer 72 which covers the exposed area of the core layer 70 are disposed on the substrate 10. A first electrode drawing section 24 and a second electrode drawing section 26 are disposed adjacent to the cladding layer 72.

In the present embodiment, a protective layer 60 is formed so as to cover the light-emitting section 100. Deterioration of the cathode 30 and the light-emitting layer 50 can be prevented by covering the light-emitting section 100 with the protective layer 60. In the present embodiment, the protective layer 60 is not formed over the entire area of the light-emitting device so as to expose the surface of the waveguide section 200 in order to form the electrode drawing sections 24 and 26. The protective layer 60 may be formed so as to cover the entire area of the light-emitting device, as required.

Each component of the light-emitting section 100 is described below in detail.

The anode 20 in the light-emitting section 100 is formed using an optically transparent conductive material. As the transparent conductive material for the anode 20, the above-mentioned materials such as ITO can be used. The anode 20, the hole transport layer 22, and the optical element 12 are continuously formed with the core layer 70 in the waveguide section 200. The insulating layer (cladding layer) 40 in the light-emitting section 100 is continuously formed with the cladding layer 72 in the waveguide section 200. There are no specific limitations to the material for the insulating layer 40 and the cladding layer 72 insofar as the material exhibits insulating properties and can confine light as a result of exhibiting a refractive index lower than those of the anode 20, the hole transport layer 22, the optical element 12, and the core layer 70.

Figure 5:
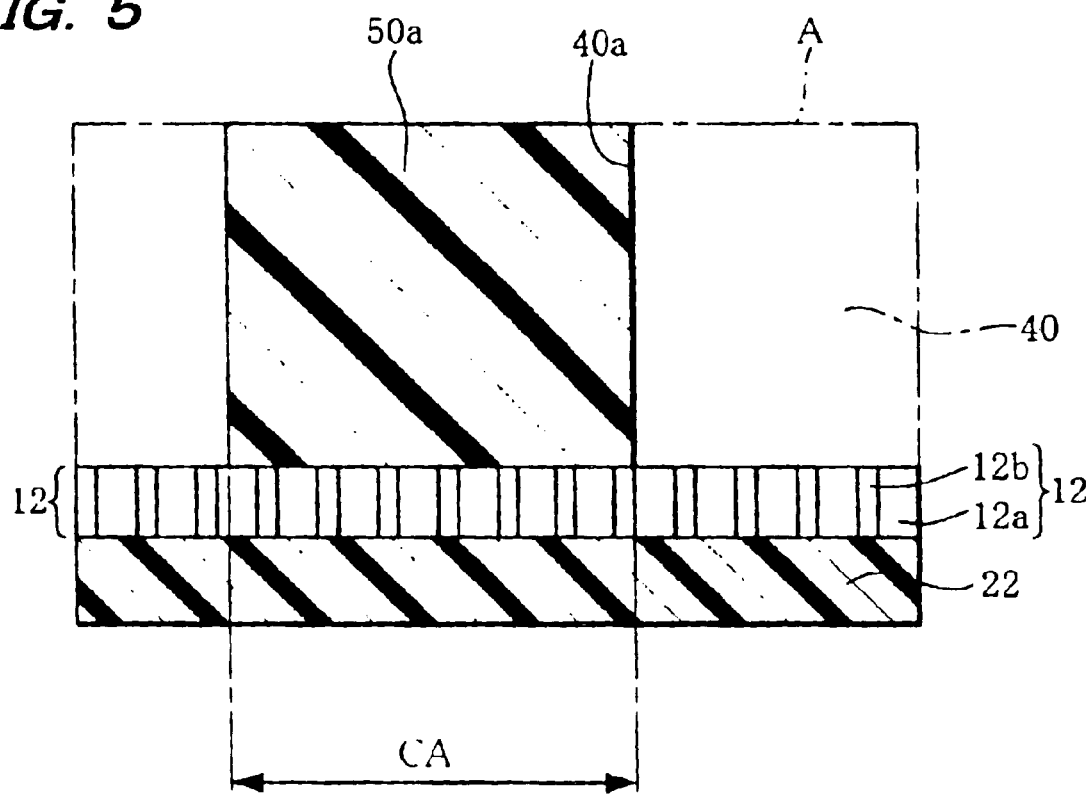
FIG. 5 is an enlarged cross-sectional view showing a section indicated by the symbol A shown in FIG. 4.

In the light-emitting section 100, the insulating layer 40 is formed so as to cover at least the exposed area of the grating-shaped optical element 12, as shown in FIGS. 4 and 7. The insulating layer 40 has a slit opening 40a extending in the periodic direction of the optical element 12, specifically, in the direction in which the medium layers having different refractive indices are arranged periodically. The anode 20 and the cathode 30 are disposed in the area in which the opening 40a is formed with the optical element 12 and the light-emitting layer 50 interposed therebetween. The insulating layer 40 is interposed between the anode 20 and the cathode 30 in the area in which the opening 40a is not formed. Therefore, the insulating layer 40 functions as a current blocking layer. Therefore, when a predetermined voltage is applied to the anode 20 and the cathode 30, current mainly flows through a region CA corresponding to the opening 40a, as shown in FIG. 5. Current can be concentrated along the direction in which light is waveguided by forming the insulating layer (current blocking layer) 40 in this manner, whereby light emission efficiency can be increased.

The optical element 12 is formed on the hole transport layer 22, in which the medium layers having different refractive indices are arranged periodically. The optical element 12 has a periodic refractive index distribution based on the shape (size) and the medium combination, and forms an incomplete photonic band in two dimensions for a predetermined wavelength range.

Figure 8:
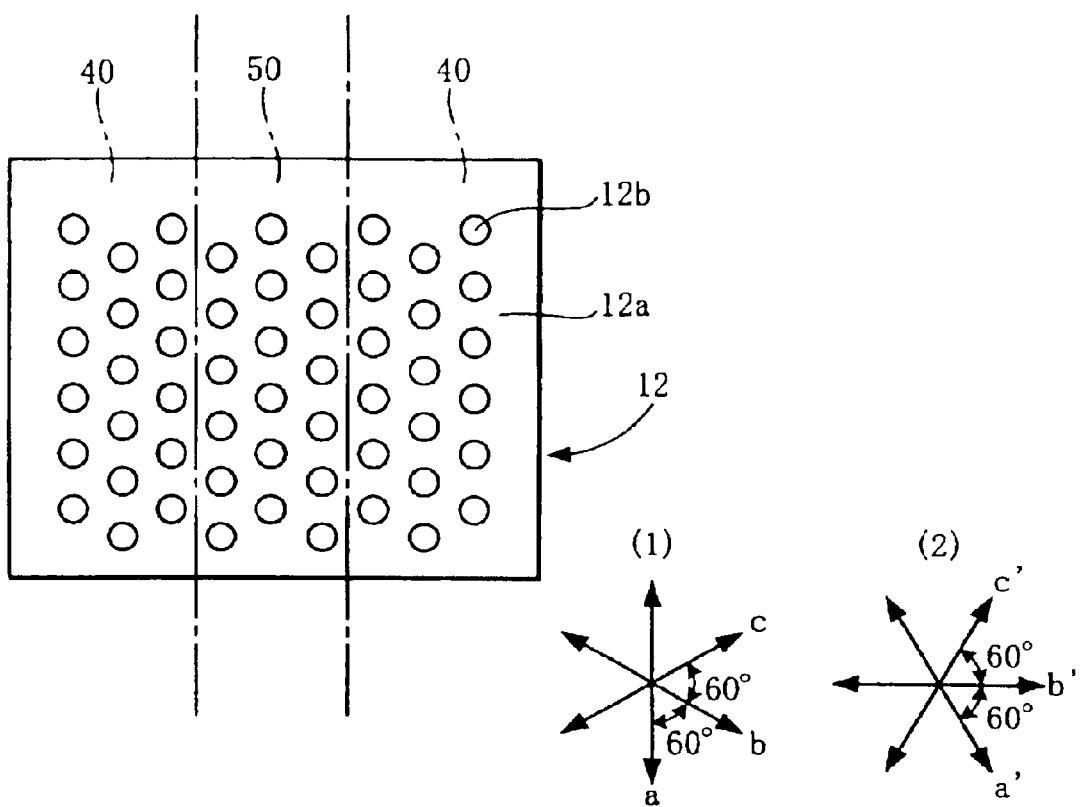
FIG. 8 is a plan view showing an optical element.
Figure 9:
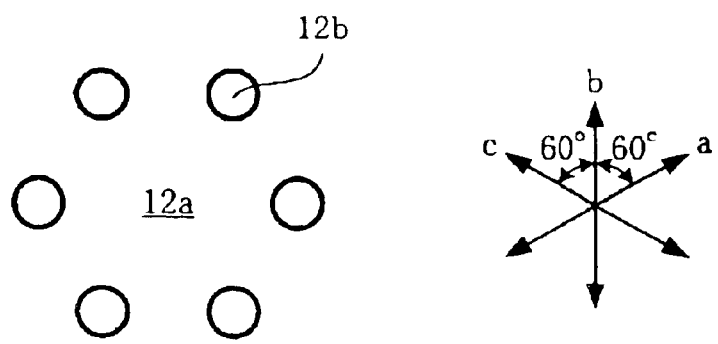
FIG. 9 is a view showing a modification of the optical element.

In the present embodiment, the optical element 12 is formed in the shape of a triangular lattice. In the optical element 12, the first medium layer 12a and the second medium layer 12b having different refractive indices are arranged in a predetermined pattern, as shown in FIG. 8, specifically, the first medium layer 12a is arranged in the shape of a triangular lattice. In more detail, transmission of light can be controlled in at least three directions (a, b, and c directions or a', b', and c' directions) in two dimensions (XY surface) as shown by symbols (1) and (2) in FIG. 8. In the case of (2) in FIG. 8, the optical element 12 has a period with a pitch twice as large as that in the case of (1) in FIG. 8.

The materials for the optical element 12 are not limited insofar as each of the first medium layer 12a and the second medium layer 12b can form a photonic crystal by periodic distribution. In the present embodiment, the second medium layer 12b is formed of an insulating material and the first medium layer 12a is formed of a material for the hole transport layer 22. The insulating material for the second medium layer 12b is preferably capable of being finely patterned, exhibiting absorption to only a small degree as a grating, and having a high refractive index suitably used as a waveguide. For example, a resist material, $TiO_2$, and the like can be used.

In the case of causing light to be emitted through the waveguide section 200 as shown in FIG. 2, light confinement conditions for the optical element on the side of the waveguide section 200 are set weaker than those for the optical element on the other side. Sufficiency of the light confinement conditions for the optical element can be controlled by the number of pairs of medium layers of the optical element, difference in the refractive indices between the medium layers in the optical element, and the like, preferably by the number of pairs of medium layers.

In the light-emitting device 2000 of the present embodiment, since light is confined by the optical element 12 having an incomplete photonic band in three directions (a, b, and c directions) at the XY surface, transmission of light in two dimensions at the XY surface can be controlled.

Light in a leaky mode can be transmitted in other directions. In order to control transmission of light in a leaky mode, a cladding layer or a dielectric multilayer mirror may be optionally provided in order to confine the light.

In the waveguide section 200, the first electrode drawing section 24 and the second electrode drawing section 26 are electrically isolated by the cladding layer 72 formed continuously with the insulating layer 40, as shown in FIG. 6. The first electrode drawing section 24 is integrally continuous with the anode 20 in the light-emitting section 100 and functions as a drawing electrode for the anode 20. The second electrode drawing section 26 is formed so as to extend toward the light-emitting section 100. Part of the second electrode drawing section 26 is electrically connected with the cathode 30. Therefore, the second electrode drawing section 26 functions as a drawing electrode for the cathode 30. In the present embodiment, the first and second electrode drawing sections 24 and 26 are formed in the same deposition step as the anode 20.

The above methods and materials may be appropriately used as the method for forming the optical element 12 of the light-emitting device 2000 and the materials for forming each layer. These methods, materials, and configurations are also applied to other embodiments described later.

An electron transport layer may be optionally provided to the light-emitting section 100 in addition to the hole transport layer 22.

(Device Operation)

The operations of the light-emitting device 2000 are described below.

Electrons and holes are injected into the light-emitting layer 50 respectively from the cathode 30 and the anode 20 by applying a predetermined voltage to the anode 20 and the cathode 30. The electrons and holes are allowed to recombine in the light-emitting layer 50, whereby excitons are generated. Light at the energy level at the band edge is transmitted through the optical element 12. Therefore, light with a wavelength specified by the energy level at the band edge is emitted preferentially in the direction in which the degree of light confinement is smaller at the XY surface. This light has a very narrow spectral width and high efficiency. Since the region CA (see FIG. 5) through which current flows is specified by the insulating layer 40 interposed between the anode 20 and the cathode 30, current can be efficiently supplied to the region from which it is desired to emit light.

Light emitted in the light-emitting layer 50 is introduced into the light-transmitting section including the hole transport layer 22 and the optical element 12. Light introduced into the light-transmitting section is transmitted toward the edge of the light-transmitting section (toward the waveguide section 200). The light is transmitted through the core layer 70 in the waveguide section 200, formed continuously and integrally with part of the light-transmitting section, and emitted from the edge of the core layer 70. Since only light within a specific wavelength range is emitted by the incomplete photonic band in two dimensions formed by the optical element 12, the emitted light has wavelength selectivity, a narrow spectral width, and excellent directivity.

Effects

Major effects of the present embodiment are described below.

(a) According to the light-emitting device 2000 of the present embodiment, the anode 20 and the cathode 30 are electrically connected through the light-emitting layer 50 with which the opening 40a in the insulating layer 40 is filled. The region through which current flows is specified by the opening 40a. Therefore, the insulating layer 40 functions as a current blocking layer, whereby current can be efficiently supplied to the light-emitting region and light emission efficiency can be increased. The light-emitting region can be set while being positioned with the core layer 70 by specifying the region to which current is supplied by the current blocking layer (insulating layer 40). This increases the efficiency of optical connection with the waveguide section 200.

(b) According to the light-emitting device 2000, electrons and holes are injected into the light-emitting layer 50 respectively from the cathode 30 and the anode 20. Light is emitted when the molecules return to the ground state from the excited state by allowing the electrons and holes to recombine in the light-emitting layer. Light within a wavelength range corresponding to the incomplete photonic band formed by the optical element 12 cannot be transmitted through the optical element. Only light within a wavelength range corresponding to the energy level at the band edge is transmitted through the optical element. Therefore, light with a very narrow spectral width with spontaneous emission inhibited in two dimensions (XY surface) can be obtained with high efficiency by specifying the energy level at the band edge.

(c) At least part of the light-transmitting section (optical element 12) in the light-emitting section 100 is integrally continuous with the core layer 70 in the waveguide section 200. This enables the light-emitting section 100 and the waveguide section 200 to be optically combined with high connective efficiency, thereby enabling efficient transmission of light. Since the light-transmitting section including the anode 20, the hole transport layer 22, and the optical element 12 and the core layer 70 can be deposited and patterned in the same steps, the fabrication can be simplified.

The insulating layer (cladding layer) 40 in the light-emitting section 100 is integrally continuous with the cladding layer 72 in the waveguide section 200. This enables the light-emitting section 100 (light-transmitting section, in particular) and the waveguide section 200 to be optically combined with high connective efficiency, thereby enabling efficient transmission of light. Moreover, since the insulating layer 40 and the cladding layer 72 can be deposited and patterned in the same steps, the fabrication can be simplified.

According to the light-emitting device 2000 of the present embodiment, the light-emitting section 100 and the waveguide section 200 can be combined with high connective efficiency, whereby emitted light with high efficiency can be obtained.

(d) in the present embodiment, the optical element 12 can be formed using either an organic material or an inorganic material. Therefore, since the light-emitting device is not affected by the irregular state or impurities at the boundary between the medium layers in the optical element as in the case of using a semiconductor as the material for the optical element, excellent characteristics by the incomplete photonic band can be obtained.

Third Embodiment

Figure 10:
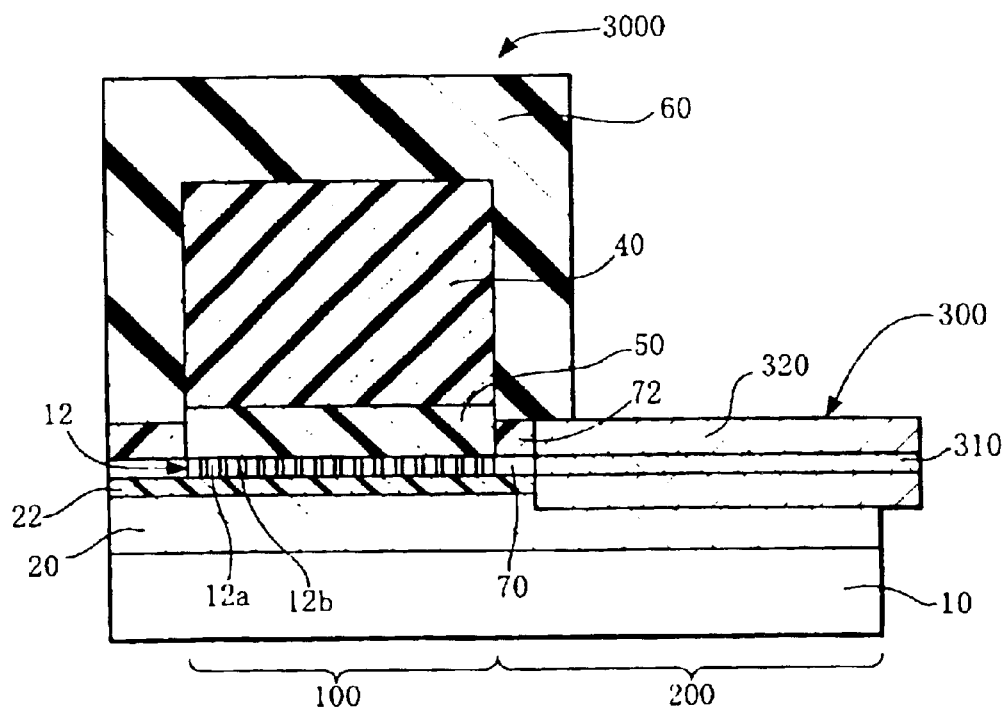
FIG. 10 is a cross-sectional view schematically showing a light-emitting device according to a third embodiment of the present invention.

FIG. 10 is a cross-sectional view schematically showing a light-emitting device 3000 according to this embodiment of the present invention. FIG. 10 corresponds to FIG. 7 used to describe the second embodiment. Sections substantially the same as those of the light-emitting device 2000 of the second embodiment are indicated by the same symbols. Detailed description of these sections is omitted.

The light-emitting device 3000 of the third embodiment differs from the light-emitting device 2000 in that an optical fiber 300 is installed in the waveguide section 200. Specifically, a recess portion for installing the optical fiber 300 is formed at a predetermined position of the waveguide section 200, and the optical fiber 300 is disposed in the recess portion. The optical fiber 300 is disposed in a state in which a core 310 and a cladding 320 are respectively positioned with the core layer 70 and the cladding layer 72 in the waveguide section 200.

According to the light-emitting device 3000, light emitted from the light-emitting section 100 can be transmitted efficiently by providing the optical fiber 300 to the waveguide section 200.

Modifications of the Light-emitting Device

Light-emitting devices having structures shown in FIGS. 11 to 15 may be employed as the light-emitting devices 1000, 2000, and 3000 of the first to third embodiments by changing the formation position of the optical element 12 or the light-emitting layer 50 or providing other layers. In these figures, sections the same as those of the light-emitting device 1000 are indicated by the same symbols. Detailed description of these sections is omitted. These modifications can also be applied to other embodiments. A section corresponding to the insulating layer 40 of the second and third embodiments is not illustrated in these figures.

FIGS. 11 to 15 are cross-sectional views schematically showing modifications (light-emitting devices 1001–1005) of the light-emitting device according to the present embodiment.

Figure 11:
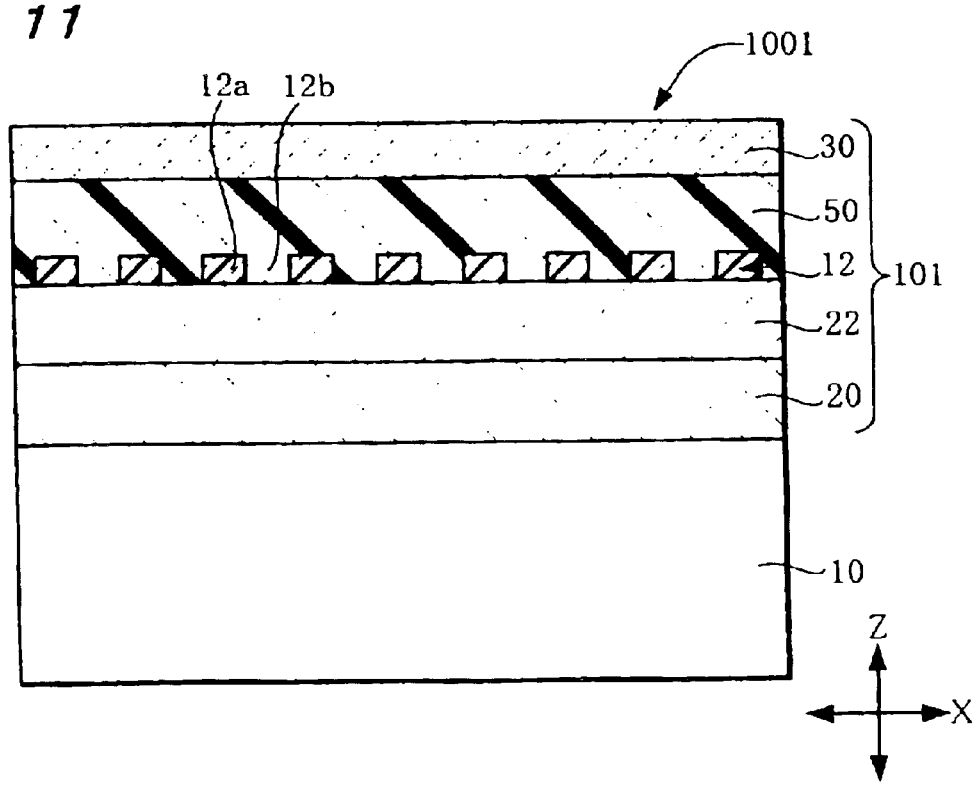
FIG. 11 is a view showing a first modification of a light-emitting section.

(a) The light-emitting device 1001 shown in FIG. 11 differs from the light-emitting device 1000 in that a light-emitting section 101 includes the hole transport layer 22.

The light-emitting device 1001 includes the substrate 10 and the light-emitting section 101 formed on the substrate 10. The light-emitting section 101 includes the anode 20, the hole transport layer 22, the optical element 12, the light-emitting layer 50, and the cathode 30 layered on the substrate 10 in that order. The optical element 12 is formed on the hole transport layer 22 and the second medium layer 12b is formed of a light-emitting layer.

The operations of the light-emitting device 1001 are described below.

Electrons and holes are introduced into the light-emitting layer 50 respectively from the cathode 30 and the anode 20 through the hole transport layer 22 by applying a predetermined voltage to the anode 20 and the cathode 30. The electrons and holes are allowed to recombine in the light-emitting layer 50, whereby excitons are generated. Light such as fluorescent light or phosphorescent light is emitted when the excitons deactivate. The succeeding operations are the same as those of the light-emitting device 1000 according to the first embodiment. Therefore, further description is omitted.

The light-emitting device 1001 has the same effects as those of the light-emitting device 1000 shown in FIG. 1. Moreover, since the light-emitting device 1001 includes the hole transport layer 22, hole transport capability can be improved.

Figure 12:
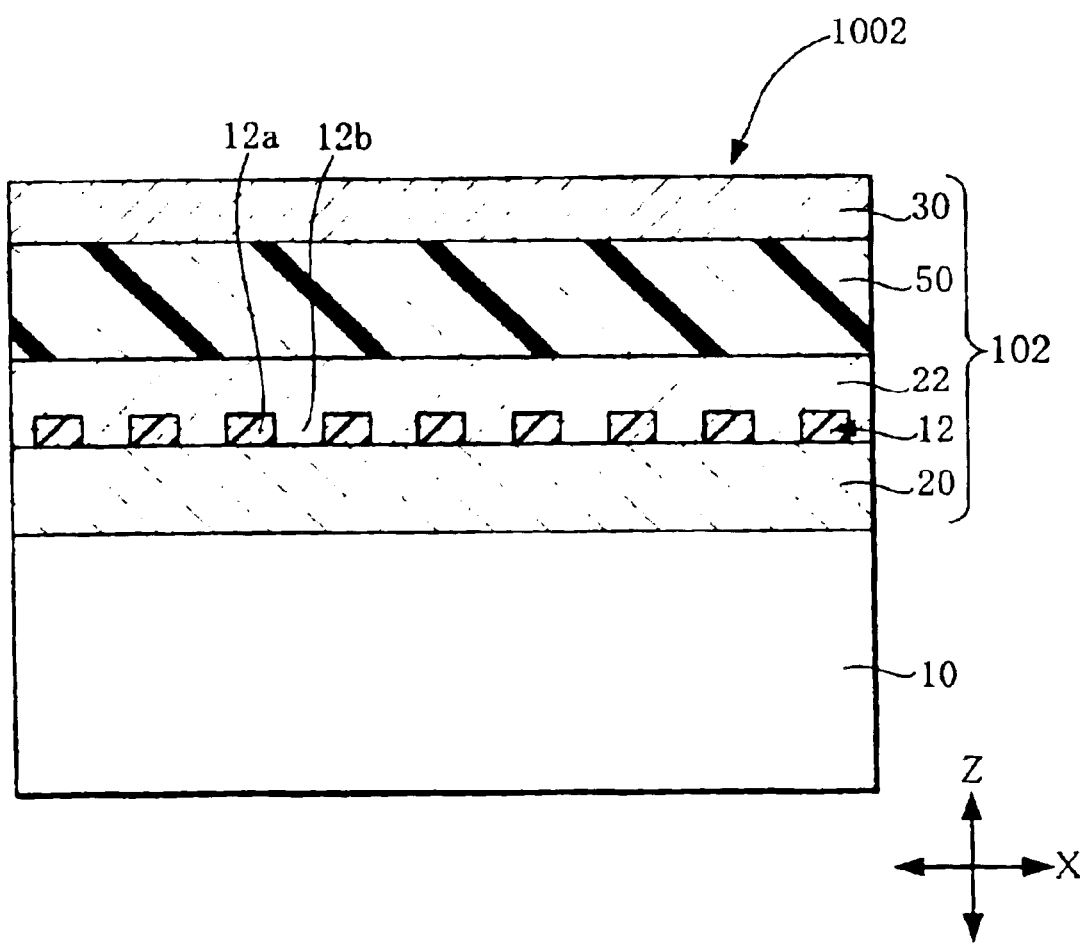
FIG. 12 is a view showing a second modification of the light-emitting section.

(b) The light-emitting device 1002 shown in FIG. 12 differs from the light-emitting device 1000 shown in FIG. 1 in that a light-emitting section 102 includes the hole transport layer 22 and the second medium layer 12b which makes up the optical element 12 is formed by the hole transport layer 22.

The light-emitting device 1002 includes the substrate 10 and the light-emitting section 102 formed on the substrate 10. The light-emitting section 102 includes the anode 20, the optical element 12, the hole transport layer 22, the light-emitting layer 50, and the cathode 30 layered on the substrate in that order.

The optical element 12 is formed on the anode 20. The second medium layer 12b which makes up the optical element 12 is continuously formed with the hole transport layer 22. Specifically, the hole transport layer 22 functions as part of the optical element 12 (second medium layer 12b).

The operations of the light-emitting device 1002 are described below.

Electrons and holes are introduced into the light-emitting layer 50 respectively from the cathode 30 and the anode 20 through the hole transport layer 22 by applying a predetermined voltage to the anode 20 and the cathode 30. The electrons and holes are allowed to recombine in the light-emitting layer 50, whereby excitons are generated. Light such as fluorescent light or phosphorescent light is emitted when the excitons deactivate. The succeeding operations are the same as those of the light-emitting device 1000 according to the first embodiment.

FIG. 12 shows an example in which the optical element 12 is formed in the hole transport layer 22. However, in the case where the anode 20 is formed using a material other than a metal such as ITO, the optical element may be formed of the hole transport layer 22 and the anode 20.

Figure 13:
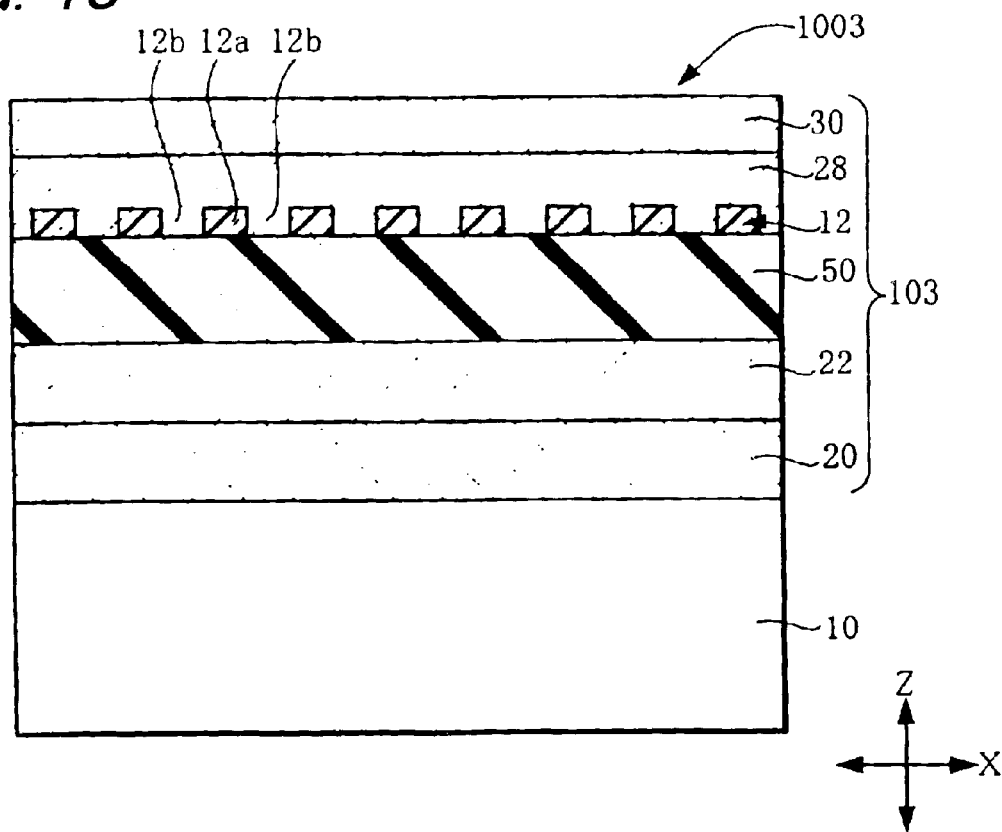
FIG. 13 is a view showing a third modification of the light-emitting section.

(c) The light-emitting device 1003 shown in FIG. 13 differs from the light-emitting device 1000 shown in FIG. 1 in that a light-emitting section 103 includes the hole transport layer 22 and an electron transport layer 28, and the second medium layer 12b which makes up the optical element 12 is continuous with the electron transport layer 28.

The light-emitting device 1003 includes the substrate 10 and the light-emitting section 103 formed on the substrate 10. The light-emitting section 103 includes the anode 20, the hole transport layer 22, the light-emitting layer 50, the optical element 12, the electron transport layer 28, and the cathode 30 layered on the substrate in that order. The optical element 12 is formed on the light-emitting layer 50, and the second medium layer 12b which makes up the optical element 12 is formed continuously with the electron transport layer 28. Specifically, the electron transport layer 28 functions as part of the optical element 12 (second medium layer 12b).

The operations of the light-emitting device 1003 are described below.

Electrons and holes are introduced into the light-emitting layer 50 respectively from the cathode 30 through the electron transport layer 28 and the anode 20 through the hole transport layer 22 by applying a predetermined voltage to the anode 20 and the cathode 30. The electrons and holes are allowed to recombine in the light-emitting layer 50, whereby excitons are generated. Light such as fluorescent light or phosphorescent light is emitted when the excitons deactivate. The succeeding operations are the same as those of the light-emitting device 1000 according to the first embodiment.

The light-emitting device 1003 has the same effects as those of the light-emitting device 1000 shown in FIG. 1. Moreover, since the light-emitting device 1003 includes the hole transport layer 22 and the electron transport layer 28, hole and electron transport capability can be improved.

FIG. 13 shows an example in which the optical element 12 is formed in the electron transport layer 28. However, in the case where the cathode 30 is formed using a material other than a metal such as a diamond, the optical element may be formed by the electron transport layer 28 and the cathode 30. In the case where the electron transport layer 28 is not formed, the optical element may be formed by the cathode 30 and the light-emitting layer 50.

Figure 14:
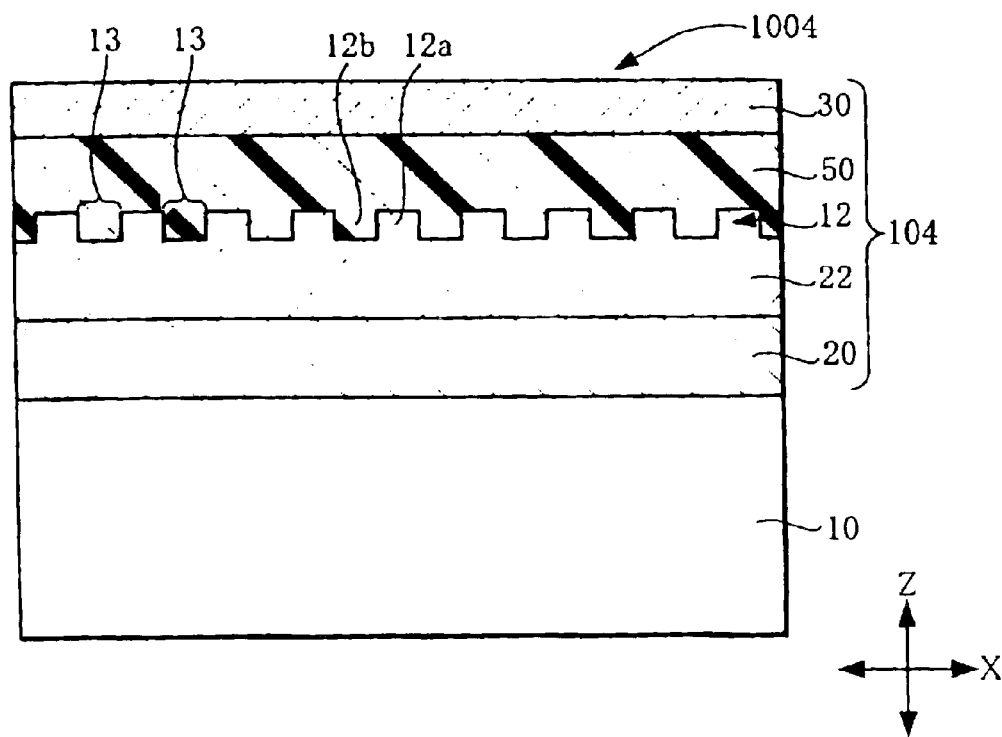
FIG. 14 is a view showing a fourth modification of the light-emitting section.

(d) The light-emitting device 1004 shown in FIG. 14 differs from the light-emitting device 1000 shown in FIG. 1 in that a light-emitting section 104 includes the hole transport layer 22. The light-emitting device 1004 has the same structure as that of the light-emitting device 1001 shown in FIG. 11 in that the light-emitting section 104 includes the hole transport layer 22, and the second medium layer 12b which makes up the optical element 12 is continuous with the light-emitting layer 50. The light-emitting device 1004 differs from the light-emitting device 1001 shown in FIG. 11 in that the first medium layer 12a which makes up the optical element 12 is continuous with the hole transport layer 22.

The light-emitting device 1004 includes the substrate 10 and the light-emitting section 104 formed on the substrate 10. The light-emitting section 104 includes the anode 20, the hole transport layer 22, the optical element 12, the light-emitting layer 50, and the cathode 30 layered in that order. The optical element 12 is formed in the boundary region between the light-emitting layer 50 and the hole transport layer 22. Specifically, the optical element 12 is formed by filling grooves 13 formed on the upper side of the hole transport layer 22 with a material for forming the light-emitting layer 50. Therefore, the first medium layer 12a which makes up the optical element 12 is continuous with the hole transport layer 22. Therefore, the hole transport layer 22 functions as part of the optical element 12 (first medium layer 12a). The second medium layer 12b which makes up the optical element 12 is continuous with the light-emitting layer 50. Therefore, the light-emitting layer 50 functions as part of the optical element 12 (second medium layer 12b).

The operations and effects of the light-emitting device 1004 are the same as those of the light-emitting device 1001 shown in FIG. 11. Therefore, further description is omitted.

The light-emitting devices 1000 to 1004 described in the above (a) to (d) have a gain coupled structure.

Figure 15:
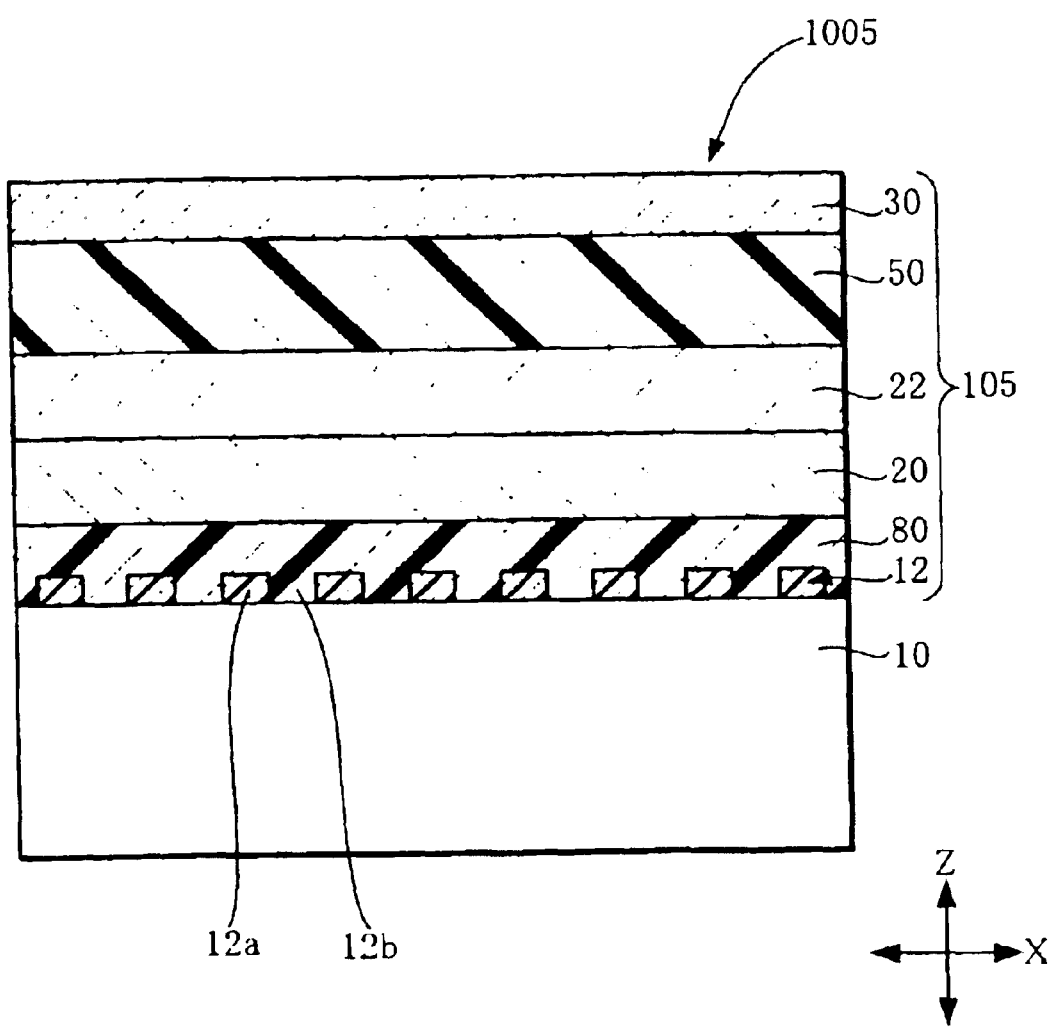
FIG. 15 is a view showing a fifth modification of the light-emitting section.

(e) The light-emitting device 1005 shown in FIG. 15 differs from the light-emitting devices 1000 to 1004 in that the optical element 12 has no gain coupled structure. The light-emitting device 1005 has the same structure as that of the light-emitting device 1001 shown in FIG. 11 in that a light-emitting section 105 includes the hole transport layer 22. The light-emitting device 1005 differs from the light-emitting device 1001 shown in FIG. 11 in that the optical element 12 is formed on the substrate 10.

The light-emitting device 1005 includes the substrate 10 and the light-emitting section 105 formed on the substrate 10. The light-emitting section 105 includes the optical element 12, an insulating layer 80, the anode 20, the hole transport layer 22, the light-emitting layer 50, and the cathode 30 layered in that order.

The optical element 12 is formed by the first medium layer 12a and the second medium layer 12b and has a refractive index coupled structure. The first medium layer 12a is formed using an insulating material. The second medium layer 12b is continuous with the insulating layer 80. Specifically, the insulating layer 80 functions as part of the optical element 12 (second medium layer 12b).

The operations and effects of the light-emitting device 1005 are the same as those of the light-emitting device 1001 shown in FIG. 11.

The present invention has been described above with reference to the embodiments. However, the present invention is not limited to the above-described embodiments, and various modifications can be made within the scope of the invention.

What is claimed is:

1. A light-emitting device comprising:
a light-emitting layer which emits light by electroluminescence;
a pair of electrode layers for applying an electric field to the light-emitting layer; and
an optical element for causing light generated in the light-emitting layer to be transmitted in a predetermined direction,
wherein the optical element forms an incomplete photonic band and wherein the light is confined by the optical element in one direction or two directions to inhibit spontaneous emission of light in one dimension or two dimensions; and
wherein light generated in the light-emitting layer is controlled by inhibiting spontaneous emission in two dimensions.

2. The light-emitting device as defined in claim 1,
wherein the light-emitting layer includes an organic light-emitting material.

3. The light-emitting device as defined in claim 1, further comprising at least one of a hole transport layer and an electron transport layer.

4. The light-emitting device as defined in claim 3,
wherein the hole transport layer or the electron transport layer is one type of medium layer in the optical element.

5. The light-emitting device as defined in claim 1,
wherein the optical element is formed so that the energy level of emission spectrum of the light-emitting layer includes the energy level at a band edge in a band formed by the optical element.

6. The light-emitting device as defined in claim 1,
wherein the optical element forms in an XY surface an incomplete photonic band of one dimension having a refractive index distribution which is periodic in one direction; and
wherein the light emitting device further comprises another optical element which inhibits spontaneous emission of light in two dimensions in combination with the incomplete photonic band of the above optical element.

7. The light-emitting device as defined in claim 1,
wherein the optical element forms in an XY surface an incomplete photonic band having a refractive index distribution which is periodic in the X-direction and the Y-direction; and
wherein the incomplete photonic band includes columnar-shaped first medium layers arranged in a shape of a tetragonal lattice and a second medium layer formed between the first medium layers.

8. The light-emitting device as defined in claim 1,
wherein the optical element forms in an XY surface an incomplete photonic band having a refractive index distribution which is periodic in first, second and third directions; and
wherein the incomplete photonic band includes columnar-shaped first medium layers and a second medium layer formed between the first medium layers.

9. The light-emitting device as defined in claim 8,
wherein the first medium layer in the optical element is arranged in a shape of a triangular lattice.

10. The light-emitting device as defined in claim 8,
wherein the first medium layer in the optical element is arranged in the shape of a honeycomb lattice.

11. A light-emitting device comprising a substrate and a light-emitting section,
wherein the light-emitting section includes:
a light-emitting layer which emits light by electroluminescence;
a pair of electrode layers for applying an electric field to the light-emitting layer,
an optical element for causing light generated in the light-emitting layer to be transmitted in a predetermined direction; and
an insulating layer which is disposed between the pair of electrode layers, partially has an opening through which current is supplied to the light-emitting layer, and functions as a current blocking layer which determines a region in which current flows,
wherein the optical element forms an incomplete photonic band and wherein the light is confined by the optical element in one direction or two directions to inhibit spontaneous emission of light in one dimension or two dimensions; and
wherein light generated in the light-emitting layer is controlled by inhibiting spontaneous emission in two dimensions.

12. The light-emitting device as defined in claim 11, wherein:
the opening in the insulating layer faces the optical element; and the opening is a slit extending in a periodic direction of the optical element.

13. The light-emitting device as defined in claim 11, wherein part of the light-emitting layer forms part of medium layers in the optical element.

14. The light-emitting device according claim 11, wherein at least the light-emitting section is covered with a protective layer.

15. The light-emitting device as defined in claim 11, further comprising a waveguide section integrally formed with the light-emitting section,
wherein the waveguide section includes:
a core layer which is integrally continuous with at least part of the optical element; and
a cladding layer which is optically continuous with the insulating layer.

16. The light-emitting device as defined in claim 15, wherein an optical fiber is provided in the waveguide section such that a core of the optical fiber is in a predetermined position relating to the core layer.

17. The light-emitting device as defined in claim 11, wherein at least part of the light-emitting layer is provided within the opening formed in the insulating layer.

18. A light-emitting device comprising a substrate, a light-emitting section and a waveguide section which transmits light from the light-emitting section, the light-emitting and waveguide sections being integrally formed on the substrate,
wherein the light-emitting section includes:
a light-emitting layer which emits light by electroluminescence;
a pair of electrode layers for applying an electric field to the light-emitting layer;
an optical element for causing light generated in the light-emitting layer to be transmitted in a predetermined direction; and
an insulating layer which is disposed between the pair of electrode layers and functions as a cladding layer,
wherein the waveguide section includes:
a core layer which is integrally continuous with at least part of the optical element; and
a cladding layer optically continuous with the insulating layer,
wherein the optical element forms an incomplete photonic band and wherein the light is confined by the optical element in one direction or two directions to inhibit spontaneous emission of light in one dimension or two dimensions, and
wherein light generated in the light-emitting layer is controlled by inhibiting spontaneous emission in two dimensions.

* * * * *